(12) United States Patent
Sun et al.

(10) Patent No.: US 7,182,605 B2
(45) Date of Patent: Feb. 27, 2007

(54) LAND GRID ARRAY SOCKET HAVING IMPROVED TERMINALS

(75) Inventors: Pei-Lun Sun, Tu-chen (TW); Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/027,723

(22) Filed: Dec. 29, 2004

(65) Prior Publication Data

US 2005/0227511 A1 Oct. 13, 2005

(30) Foreign Application Priority Data

Apr. 9, 2004 (TW) .............................. 93109872 A

(51) Int. Cl.
*H01R 4/58* (2006.01)

(52) U.S. Cl. ........................................... 439/66; 439/91

(58) Field of Classification Search .................. 439/66, 439/71, 91
See application file for complete search history.

(56) References Cited

U.S. PATENT DOCUMENTS

| | | | | |
|---|---|---|---|---|
| 3,631,380 A | * | 12/1971 | Bohn ........................ | 439/638 |
| 4,548,451 A | * | 10/1985 | Benarr et al. ................. | 439/85 |
| 5,139,427 A | * | 8/1992 | Boyd et al. ................... | 439/66 |
| 5,380,210 A | * | 1/1995 | Grabbe et al. ................ | 439/66 |
| 5,820,389 A | * | 10/1998 | Hashiguchi .................. | 439/66 |
| 6,132,220 A | * | 10/2000 | McHugh et al. .............. | 439/66 |
| 6,146,152 A | * | 11/2000 | McHugh et al. .............. | 439/66 |
| 6,827,586 B2 | * | 12/2004 | Noda et al. ................... | 439/71 |
| 6,843,659 B2 | * | 1/2005 | Liao et al. .................... | 439/66 |
| 6,881,070 B2 | * | 4/2005 | Chiang ........................ | 439/66 |

\* cited by examiner

*Primary Examiner*—Tulsidas C. Patel
*Assistant Examiner*—Harshad C Patel
(74) *Attorney, Agent, or Firm*—Wei Te Chung

(57) ABSTRACT

A land grid array socket (1) in accordance with the present invention is provided. The socket comprises an insulative housing (2) having a plurality of passageways (24) extending throughout an upper mating surface (22) and a lower mounting surface (20). A plurality of electrical terminals (3) are received in corresponding passageways, each terminal comprises a first part (32) having a first spring arm (322) extending out of the upper mating surface for electrically connected to an IC chip (4) and a second spring arm (306) extending out of the lower mounting surface for electrically connected to a motherboard (5). The first part and the second part are accommodated in a same passageway and separate from each other while interconnected by a third spring arm (304) settled therebetween.

12 Claims, 7 Drawing Sheets

US 7,182,605 B2

LAND GRID ARRAY SOCKET HAVING IMPROVED TERMINALS

BACKGROUND OF THE INVENTION

1. Field of the Invention

The present invention relates to the art of electrical connectors, and more particularly to electrical contacts for a land grid array (LGA) socket.

2. Description of the Related Art

A conventional land grid array (LGA) socket 6 is illustrated in FIGS. 6–7. The socket 6 basically comprises an insulative housing 60 having a plurality of passageways formed therein, each passageway receiving an electrical terminal 62 therein. The terminal 62 is made from one piece, and includes a base portion 620 having barbs 621 formed thereon for securing the terminal 62 in the passageway and a pair of spring arms 622 and 624 respectively extending out of opposite surfaces of the housing 60 and resisting two separate electronic components 7 and 8 so as to establish electrical connection between two electronic components 7 and 8.

Referring to FIG. 7, when the electronic components 7 and 8 are pressed down to their final position, a height H between the components 7 and 8 are normally unchangeable in order to maintain a sufficient pressing force between the spring arm 622 and 624 as desired by establishing an effective electrical connection. However, under some particular design consideration, there is a need to increase the height H. Consequently, the base portion 620 of the terminal 62 has to be elongated such that the whole length of the terminal 6 can satisfy the requirement of the increased height H. As a result, dies for manufacture of such a terminal 62 have to be modified to make a different configuration, which increases the overall cost of the LGA socket 6 and makes the manufacture process of the LGA socket become relatively complicated.

Further, the LGA socket is often used to transmit high frequency signals, which requires the terminals used in the socket have a relatively high capacitance and a relatively low impedance. However, the terminal 62 as disclosed in FIGS. 6 and 7 has a very simple configuration and its low capacitance and high impedance cannot fulfill the requirement of high frequency signal transmission. Therefore, there is a need to invent an improved terminal to resolve the above-mentioned shortcomings.

SUMMARY OF THE INVENTION

An electrical contact according to an embodiment of the present invention is provided for usable in an electrical connector for interconnecting a first electronic component and a second electronic component. The electrical contact comprises a first contact piece and a second contact piece. Each of the contact pieces is stamped from a sheet of material. The first contact piece and the second contact piece are adapted to be retained in a common passageway of the electrical connector. The first contact piece and the second contact piece are physically spaced apart to commonly form at least a part of a substantially hollow tube. The at least a part of the hollow tube is configured to define a space radially and axially encircling the passageway with respect to a longitudinal axis of the passageway. The first contact piece further includes a first contact portion adapted for engaging with the first electronic component. The second contact piece further includes a second contact portion adapted for engaging with the second electronic component.

In a preferred embodiment, the at least a part of the hollow tube comprises at least a pair of planar plates parallel to each other. Thus, a relatively high capacitance and a relatively low impedance can be formed between the pair of planar plates of the at least a part of the hollow tube. Further, since the contact is comprised of two separate contact pieces, dies for manufacture of such a terminal are identical to those for manufacture of a conventional terminal except for additional manufacture processes are needed.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made to the drawings to describe preferred embodiments of the present invention in detail.

Figure 1:
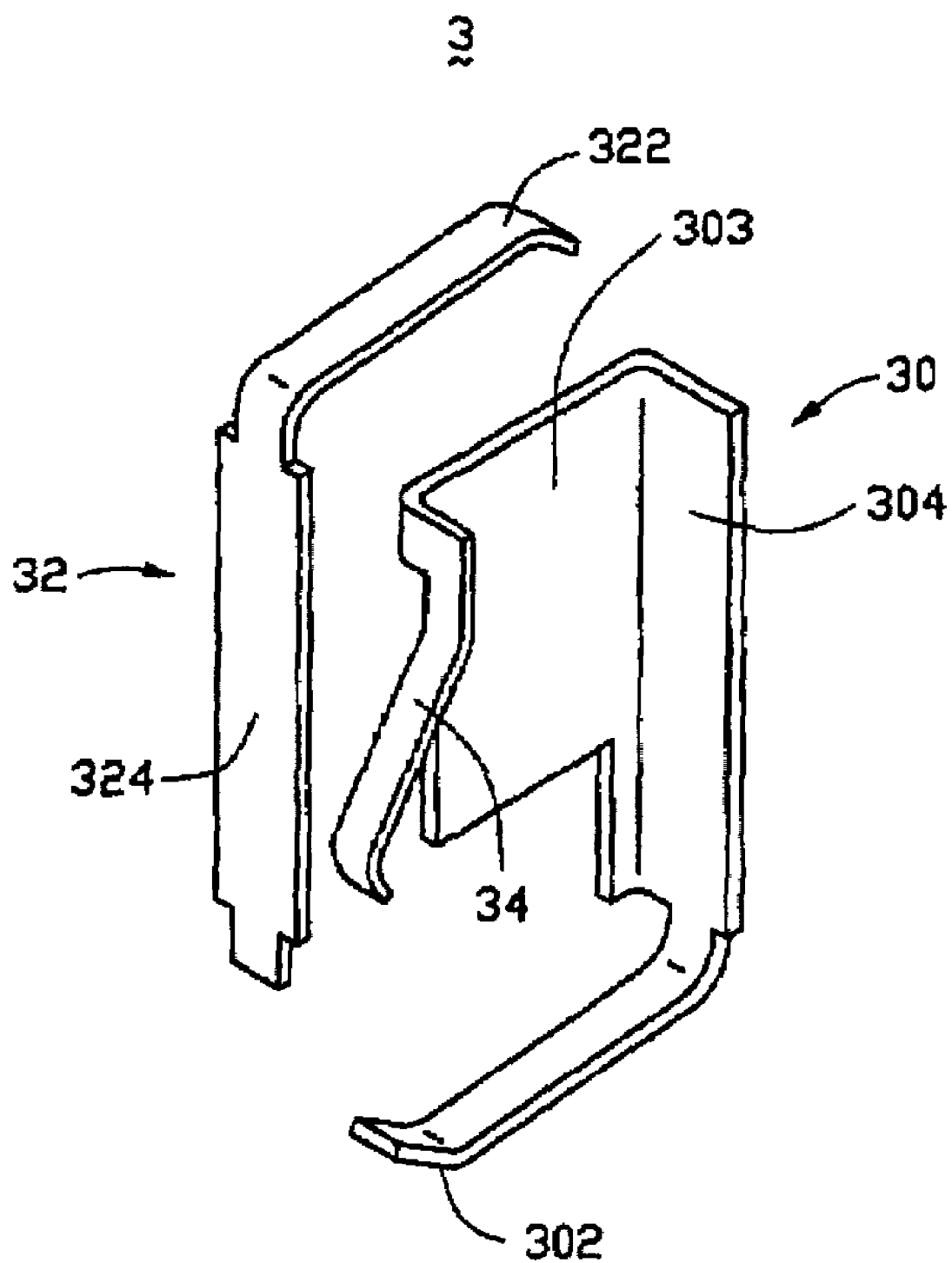
FIG. 1 is an perspective view of an electrical terminal of a land grid array (LGA) socket in accordance with a first embodiment of the present invention.
Figure 2:
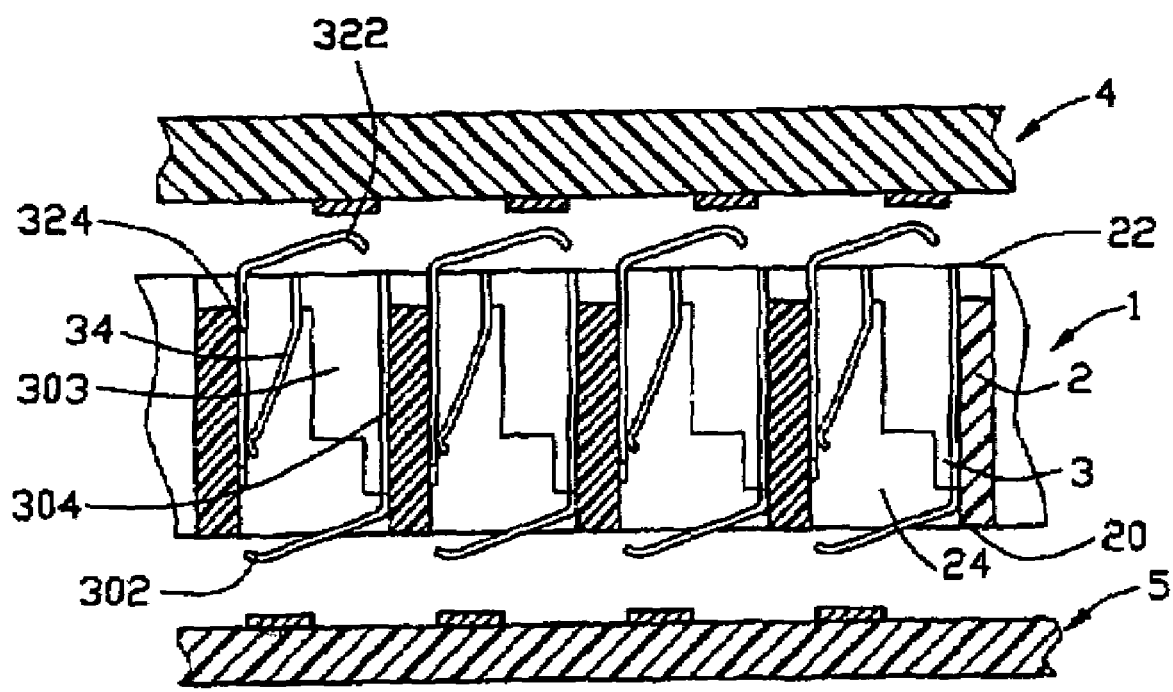
FIG. 2 is a cross-sectional view showing the terminal of FIG. 1 being received in an insulative housing of the LGA socket, before two electronic components establish electrical connection with the terminals.
Figure 3:
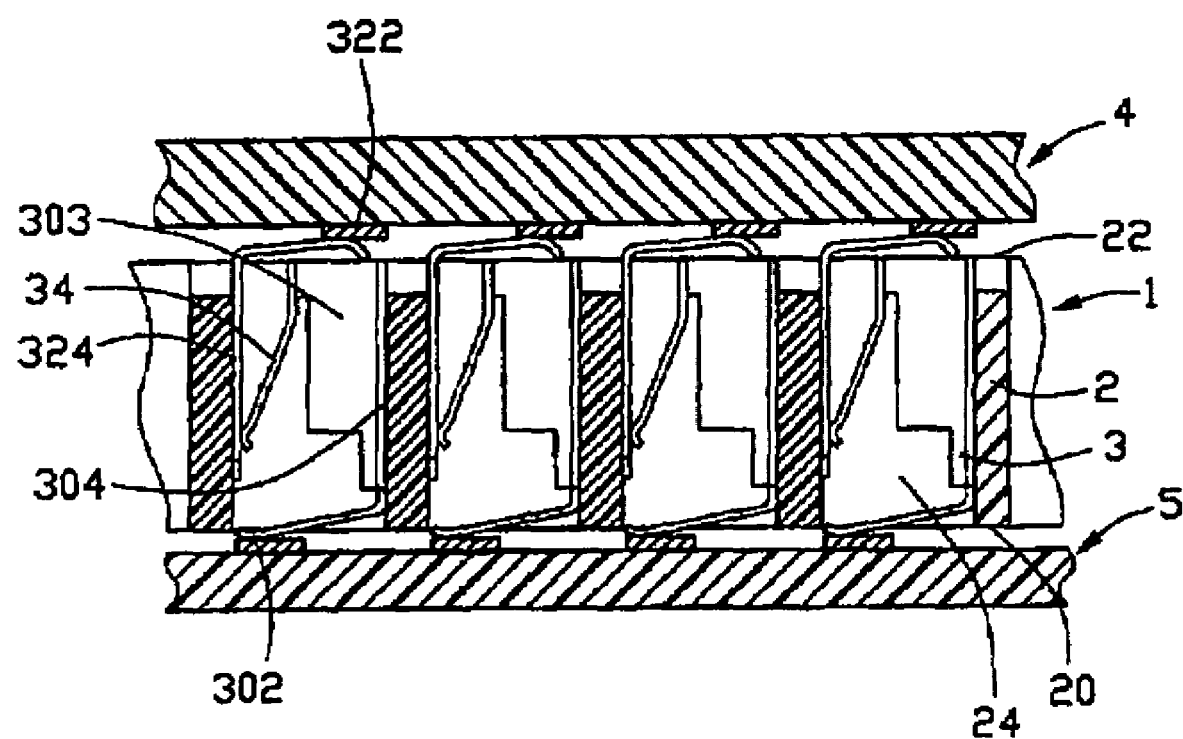
FIG. 3 is similar to FIG. 2, showing the state after the two electronic components establish electrical connection with the terminals.

Referring to FIGS. 1 to 3, a land grid array (LGA) socket 1 in accordance with a first embodiment of the present invention is illustrated. The socket 1 comprises an insulative housing 1 having a plurality of passageways 24 formed therein, each passageway 24 extends throughout a mating surface 22 and a mounting surface 20 of the housing 2 and accommodates an electrical terminal or contact 3 therein.

The terminal 3 comprises a first contact piece 30, a second contact piece 32 and a spring element 34 extending between the first contact piece 30 and the second contact piece 32. The first contact piece 30 and the second contact piece 32 are adapted to be retained in a common passageway 24 of the insulative housing 2. The first contact piece 30 includes a first contact or mating portion 302 extending out of the mating surface 22 of the insulative housing 2 and adapted for electrically mating one of the electronic components, for example a motherboard 5. The second contact piece 32 includes a second contact or mating portion 322, opposite to the first contact portion 302, extending out of the mounting surface 20 of the insulative housing 2 and adapted for electrically mating another electronic component, for example an IC package 4.

Each of the contact pieces is stamped from a sheet of conductive or metal material. The first contact piece 30 and the second contact piece 32 are physically spaced apart to commonly form at least a part of a substantially hollow tube. In this embodiment, the hollow tube is of a substantially rectangular shape. That is, the first contact piece 30 and the second contact piece 32 are combined to form a part of a rectangular hollow tube. Such a hollow tube is configured to define a space substantially radially and axially encircling the passageway 24 with respect to a longitudinal axis of the passageway 24. Thus, the second contact portion 322 is configured to extend from one side portion of the hollow tube, while the first contact portion 302 is configured to extend from an opposite side portion of the hollow tube.

The first contact piece 30 further includes a middle portion having a planar rear wall 303 and a planar side wall 304. The second contact piece 32 further includes a middle portion having a planar side wall 324. The planar side wall 304 of the first contact piece 30 and the side wall 324 of the second contact piece 32 are parallel to a common longitudinal axis of the passageway 24. Thus, a relatively high capacitance is formed between the side walls of the first contact piece 30 and the second contact piece 32. Further, since the terminal tube is comprised of planar walls, a relatively low impedance is also achieved by such a terminal 3.

The spring element 34 is configured to extend from the first contact piece 30 toward the second contact piece 32. Specifically, in this embodiment, the spring element 34 integrally extends from the rear wall 303 of the first contact piece 30 toward the planar side wall 324 of the second contact piece 32 while being discrete from the side wall 324 of the second contact piece 32 so as to enable the second contact piece 32 be movable relative to the first contact piece 30. As such, a height between two mating electronic component can be changed by having the contact portion 322 of the second contact piece 32 movable relative to the contact portion 302 of the first contact piece 30. Further, the spring element 34 extends between the planar side wall 304 of the first contact piece 30 and the planar side wall 324 of the second contact piece 32 such that the side walls of the first contact piece 30 and the second contact piece 32 elastically engage corresponding wall faces of the passageway 24 so as to enable the whole terminal 3 to be securely retained in the passageway 24 by the spring element 34 therebetween.

Referring to FIGS. 1 and 2, in assembly, the first contact piece 30 is insertable into the passageway 24 with its side wall 304 of the first contact piece 30 engaging one wall face of the passageway 24. The second contact piece 32 is then insertable into the common passageway 24 with its side wall 324 of the second contact piece 32 elastically engaging an opposite wall face of the passageway 24 by the spring element 34 between the first contact piece 30 and the second contact piece 32. The second contact piece 32 is movable relative to the first contact piece 30 such that the height between the first contact portion 322 and the second contact portion 302 is adjustable. Thereby, various heights between the two electronic components are achieved according to different applications. In addition, since the terminal is comprised of two separate contact pieces, dies for manufacture of such a terminal are identical to those for manufacture of a conventional terminal except for additional manufacture processes are needed.

Figure 4:
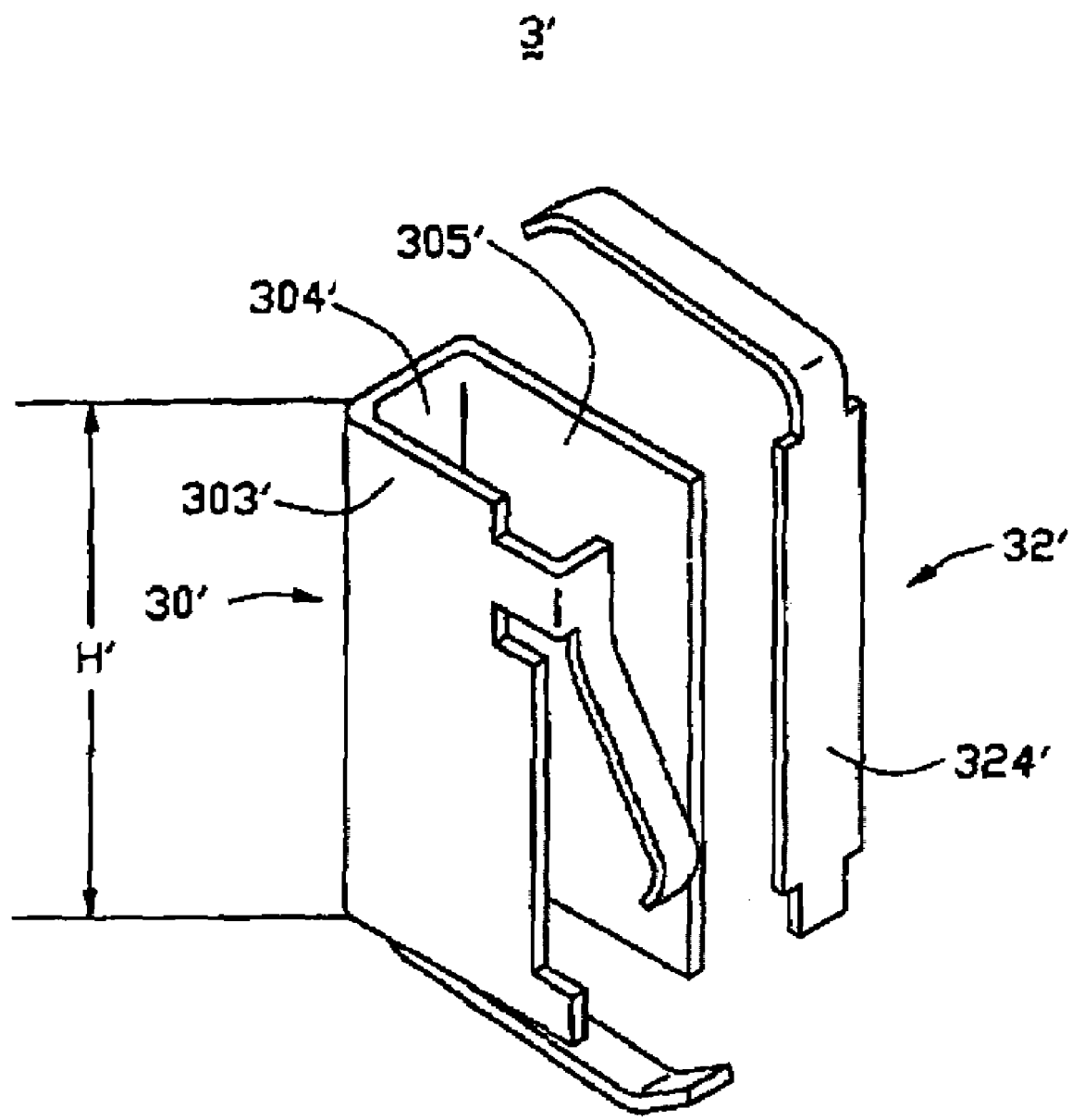
FIG. 4 is an perspective view of an electrical terminal in accordance with a second embodiment of the present invention.

Referring to FIG. 4, an electrical terminal 3' in accordance with a second embodiment is shown. The terminal 3' is similar to the terminal 3 of the first embodiment except for the first contact piece 30'. The first contact piece 30' of this embodiment includes a middle portion having a front wall 305', a rear wall 303', and a planar side wall 304' thereof. In this embodiment, both of the front wall 305' and the rear wall 303' are planar and parallel to a longitudinal axis of the passageway (not shown), thereby having another relatively high capacitance between the front wall 305' and the rear wall 303' of the first contact piece 30', as well as a relatively high capacitance between the side wall 304' of the first contact piece 30' and the side wall 324' of the second contact piece 32'. The first contact piece 30' and the second contact piece 32' are physically spaced apart to commonly form a complete hollow tube, rather than a part of a hollow tube. In this embodiment, the hollow tube is of a substantially rectangular shape. The terminal tube is configured to define a space substantially radially and axially encircling the passageway with respect to a longitudinal axis of the passageway.

Figure 5:
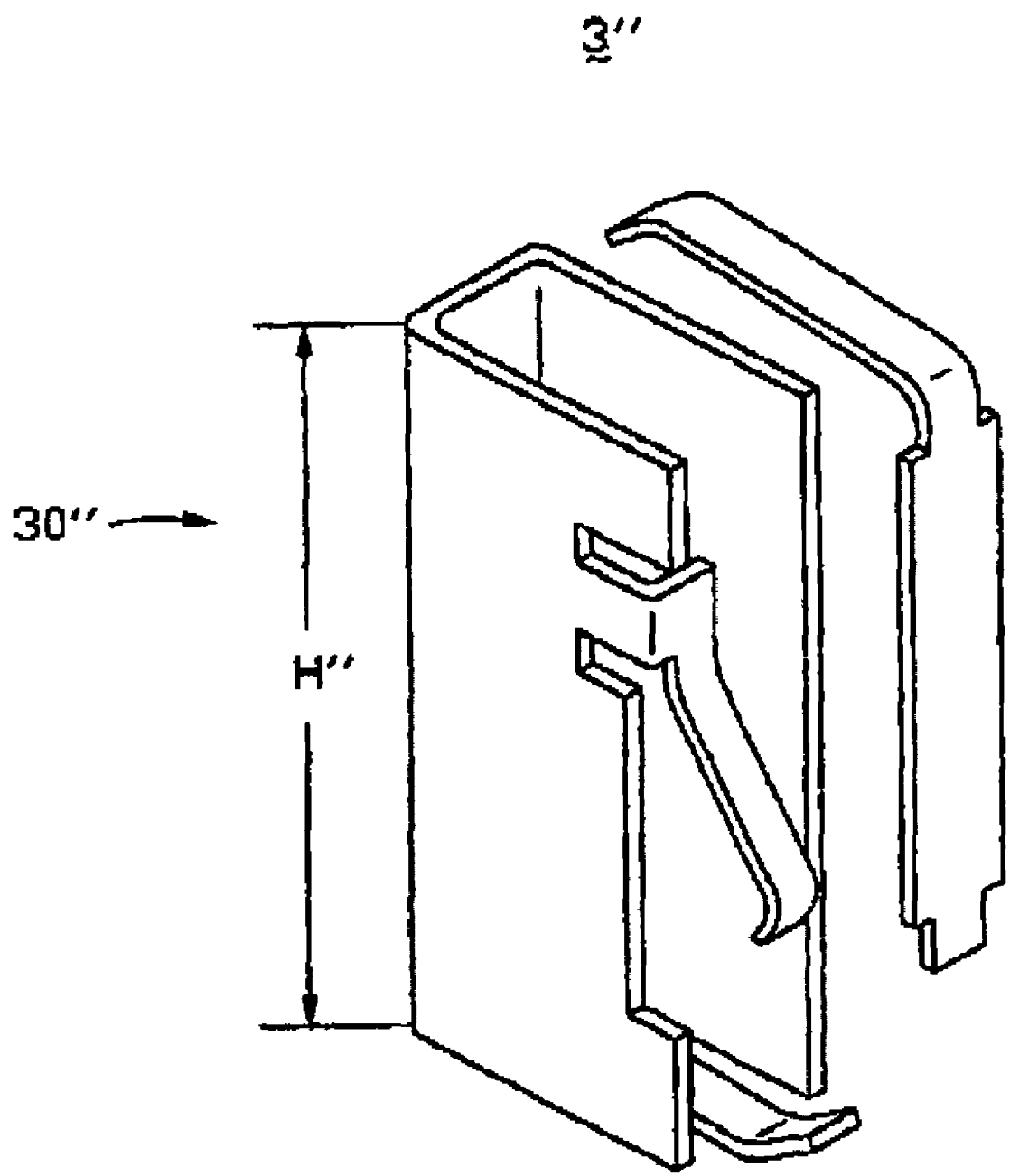
FIG. 5 is an perspective view of an electrical terminal in accordance with a third embodiment of the present invention.
Figure 6:
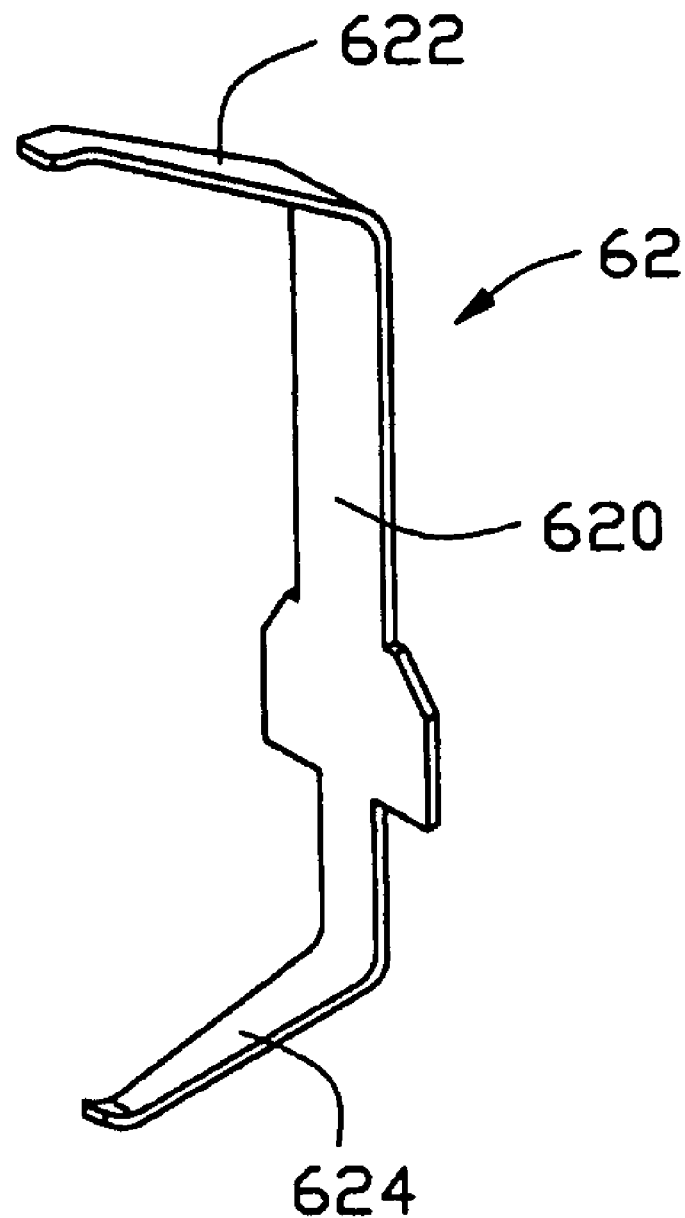
FIG. 6 is an perspective view of a conventional LGA terminal.
Figure 7:
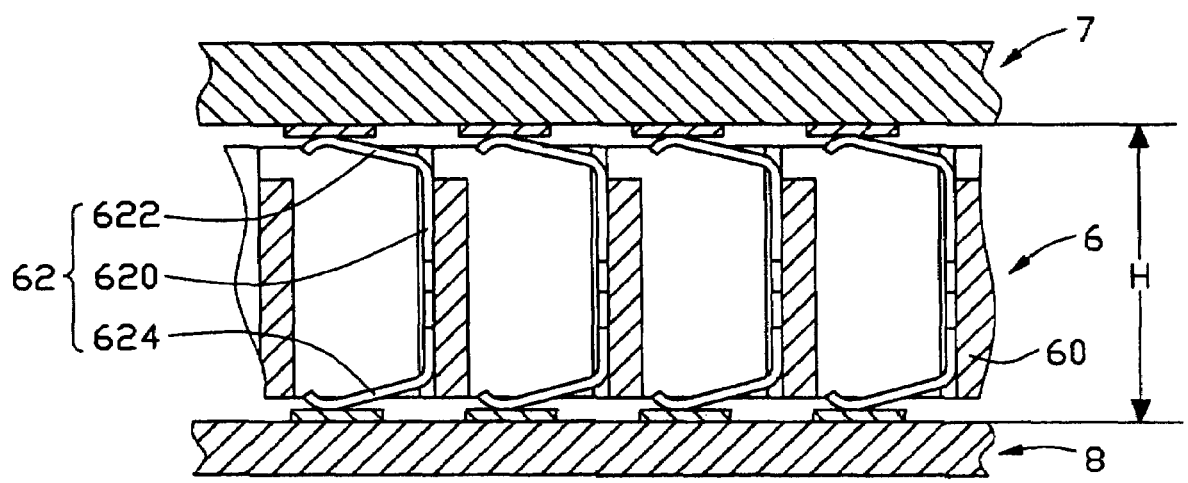
FIG. 7 is an cross-sectional view of a conventional LGA socket.

Two preferred embodiments in accordance with the present invention have been shown and described. However, in another alternative embodiment as shown in FIG. 5, a vertical length H' of the first contact piece 30" of the terminal 3" is longer than a vertical length H' of the first contact piece 30' of the terminal 3', this kind of modification can also modify the high frequency characteristic of the terminal to its desired level. Further, in another alternative embodiment, the spring element can also be set on the second contact piece or other place in the passageway, if only it can function as a bridge portion to interconnect the first and second contact pieces of the terminal. Therefore, equivalent modifications and changes known to persons skilled in the art according to the spirit of the present invention are considered within the scope of the present invention as defined in the appended claims.

What is claimed is:

1. An electrical contact usable in an electrical connector for interconnecting a first electronic component and a second electronic component, the electrical contact comprising:
    a first contact piece and a second contact piece, each of the contact pieces stamped from a sheet of material;
    the first contact piece and the second contact piece adapted to be retained in a common passageway of the electrical connector, the first contact piece and the second contact piece being physically spaced apart to commonly form at least a part of an axially-extending hollow tube that is aligned about a reference axis, said reference axis extending parallel to a lengthwise axis of the passageway, said at least a part of the hollow tube configured to define a space radially and axially encircling the passageway with respect to said lengthwise axis of the passageway;
    the first contact piece and the second contact piece being electrically connected by a contacting piece therebetween;
    the first contact piece further including a first contact portion adapted for engaging with the first electronic component; and
    the second contact piece further including a second contact portion adapted for engaging with the second electronic component.

2. The electrical contact as in claim 1, wherein said hollow tube is of a substantially rectangular shape.

3. The electrical contact as in claim 1, wherein the contacting piece integrally extends from the first contact piece towards the second contact piece while being discrete from the second contact piece so as to enable the second contact piece movable relative to the first contact piece.

4. The electrical contact as in claim 1, wherein said hollow tube includes at least a pair of planar plates parallel to each other.

5. An electrical contact usable in an electrical connector for interconnecting a first electronic component and a second electronic component, the electrical contact comprising:
- an intermediate portion for being retained in a passageway of the electrical connector;
- the intermediate portion stamped from a sheet of material to form at least a part of a hollow tube, said at least a part of the hollow tube having at least a pair of planar sections parallel to a longitudinal axis of the passageway;
- an upper mating portion extending from said tube of the intermediate portion for mating with the first electronic component; and
- a lower mating portion extending from said tube opposite to the upper mating portion for mating with the second electronic component.

6. An electrical contact as in claim 5, wherein said planar sections of the intermediate portion are physically separated from each other.

7. An electrical contact as in claim 5, wherein said hollow tube is of a substantially rectangular shape.

8. An electrical contact as in claim 5, wherein said upper mating portion extends from a first side of said tube of the intermediate portion, and said lower mating portion extends from an opposite second side of said tube.

9. An electrical connector comprising:
- an insulative housing having a mating surface adapted to mate with a first electronic component and an opposite mounting surface adapted to be mounted on a second electronic component, the housing including a plurality of passageways throughout the mating surface and the mounting surface;
- a plurality of electrical terminals received in corresponding passageways, respectively; each terminal including a first part having a first contact portion extending to the mating surface for electrically connected to the first electronic component and having a second contact portion extending toward the mounting surface for electrically connected to the second electronic component; and wherein
- the first part is electrically connected to the second part via a connecting portion formed therebetween, and the first part and the second part are spaced apart to commonly define a space radially and axially encircling the inner passageway along a reference axis, said reference axis extending parallel to a lengthwise axis of the passageway, the first part cooperating with the second part for increasing the capacitance of the terminal while decreasing the impedance of the terminal; wherein;
- said space extends axially with a distance which is at least one third of an axial length of the inner passageway.

10. The electrical connector of claim 9, wherein the first part comprises a first base portion and a first spring arm extends out of the mating surface from the one end of the base portion.

11. The electrical connector of claim 10, wherein the second part comprises a second base portion which has a end wall and two side walls bending vertically from opposite side of the end wall, the space being formed among the end wall, the side walls and a main plane of the first base portion.

12. The electrical connector of claim 9, wherein one of the first part and the second part includes unitarily a bridging section which is engaged with the other in a transverse direction perpendicular to said lengthwise axis of the passageway.

* * * * *